(12) United States Patent  
Feldtkeller

(10) Patent No.: US 8,786,375 B2
(45) Date of Patent: Jul. 22, 2014

(54) RUNTIME COMPENSATED OSCILLATOR

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 221 days.

(21) Appl. No.: 13/157,080

(22) Filed: Jun. 9, 2011

(65) Prior Publication Data

US 2012/0313720 A1 Dec. 13, 2012

(51) Int. Cl.
*H03K 3/26* (2006.01)

(52) U.S. Cl.
USPC .......... 331/111; 331/143; 331/149; 331/150; 331/153; 327/185

(58) Field of Classification Search
USPC .......... 331/111, 143, 149, 150, 153; 327/185
See application file for complete search history.

(56) References Cited

U.S. PATENT DOCUMENTS

| 6,646,513 | B1 * | 11/2003 | Neidorff ..................... 331/143 |
| 7,034,627 | B1 * | 4/2006 | Kudari ........................ 331/143 |
| 2009/0108948 | A1 | 4/2009 | Kim | |
| 2010/0013566 | A1 | 1/2010 | Kim | |
| 2010/0090772 | A1 | 4/2010 | Hu et al. | |
| 2010/0164638 | A1 | 7/2010 | Saw | |

FOREIGN PATENT DOCUMENTS

WO WO 2004/107576 A1 12/2004

* cited by examiner

*Primary Examiner* — Arnold Kinkead
*Assistant Examiner* — Richard Tan
(74) *Attorney, Agent, or Firm* — Slater & Matsil, L.L.P.

(57) ABSTRACT

Disclosed is a method for generating an oscillating signal and an oscillator circuit.

25 Claims, 8 Drawing Sheets

RUNTIME COMPENSATED OSCILLATOR

TECHNICAL FIELD

Embodiments of the present invention relate to an oscillator and to a method for generating an oscillating signal.

BACKGROUND

Oscillators are widely used in electronic circuits for generating a clock signal. Those clock signals are, for example, used in switching converters for defining the frequency of a pulsewidth modulated (PWM) signal, in digital circuits for synchronizing the operation of individual devices in the digital circuit, or in communication devices for synchronizing a transmitter and a receiver each coupled to a transmission channel.

Different types of oscillators are known, such as quartz oscillators, micromechanical oscillators, or relaxation oscillators. Relaxation oscillators include a capacitive component that is periodically charged and discharged with a constant current in order to generate a triangular oscillating signal. In this kind of oscillator, a voltage across the capacitive component is compared with at least one reference voltage in order to define the times when the oscillator switches between charging and discharging, and vice versa, of the capacitive component. This requires the use of at least one comparator. Comparators, however, have a propagation delay that is dependent on a plurality of different factors and that influence the frequency of the oscillating signal. The propagation delay of a comparator can be dependent on variations in its manufacturing process, but also on external factors during its operation, such as the ambient temperature. Those external factors, that may vary over time, may result in an oscillating signal with a time-varying frequency.

There is a need to provide a relaxation oscillator that generates an oscillating signal with a stable frequency and that can be integrated in an integrated circuit, and to provide a method for generating an oscillating signal with a fixed frequency.

SUMMARY OF THE INVENTION

A first aspect of the invention relates to a method for generating an oscillating signal. The method includes providing a plurality of n, with n≥2, capacitive storage elements. Each of these capacitive storage elements can assume a first charging state and a second charging state, providing at least two threshold detectors. Each capacitive storage element has one threshold detector associated thereto. Each threshold detector is connected to detect the charging state of the at least one associated capacitive storage element. One oscillation period of the oscillating signal is generated such that it includes at least n subsequent sub-periods. Generating each sub-period includes changing the charging state of one capacitive storage element from the first charging state as detected by the associated threshold detector to the second charging state as detected by the associated threshold detector. Changing the charging state includes providing a constant charging current to the capacitive storage element. Generating each sub-period further includes setting back the charging state of the one capacitive storage element to the first charging state after the sub-period.

A second aspect relates to a method for generating an oscillating signal having subsequent oscillator signal periods. The method includes providing n, with n≥2, oscillator units, wherein each of the oscillator units is configured to alternately assume an active mode and a preset mode. Each oscillator unit has an internal state that can assume a first and a second state and has an internal runtime and comprises a capacitive storage element. One oscillator signal period of the oscillator signal is generated as a sequence of at least n sub-periods, each sub-period having a sub-period duration defined by one oscillator unit in the active mode, where the duration of two directly subsequent sub-periods are defined by two different oscillator units. Each oscillator unit changes its internal state from the first state to the second state in the active mode, and is preset to the first state in the preset state. The first state and the second state are defined by a charging state of the corresponding capacitive storage element, with the charging state being defined by an amount of electrical charge stored in the capacitive storage element. In the capacitive storage element the first and the second state comprises a same offset charge that is dependent on the internal runtime, so that a charge difference between the amount of charge stored in the capacitive storage element in the first state and the amount of charge stored in the capacitive storage element in the second state is independent on the internal runtime.

A third aspect relates to a method for generating a time duration of one sub-clock signal of a clock signal. The method includes precharging a capacitive storage element until a threshold detector detects that a voltage at a first terminal of the capacitive storage element has crossed a threshold. Charging the capacitive storage element stops when the threshold detector detects that the voltage at a first terminal of the capacitive storage element has crossed a first threshold. Charging the capacitive storage element continues when a time interval for generating the sub-clock begins. The sub-clock is terminated when the threshold detector detects that the voltage at a first terminal of the capacitive storage element has crossed a second threshold.

A fourth aspect relates to an oscillator, including n, with n≥2, oscillator units. Each of the oscillator units is configured to alternately assume an active mode and a preset mode. Each oscillator unit has an internal state that can assumes a first and a second state and has an internal runtime and comprises a capacitive storage element. The oscillator circuit is configured to generate one oscillator signal period of the oscillator signal as a sequence of at least n sub-periods, each sub-period having a sub-period duration defined by one oscillator unit in the active mode. The duration of two directly subsequent sub-periods are defined by two different oscillator units. Each oscillator unit changes its internal state from the first state to the second state in the active mode, and is preset to the first state in the preset state. The first state and the second state is defined by a charging state of the corresponding capacitive storage element, with the charging state being defined by an amount of electrical charge stored in the capacitive storage element. The capacitive storage elements in the first and in the second state comprise a same offset charge that is dependent on the internal runtime, so that a charge difference between the amount of charge stored in the capacitive storage element in the first state and the amount of charge stored in the capacitive storage element in the second state is independent on the internal runtime.

A further aspect relates to an oscillator circuit including at least two oscillator units. The at least two oscillator units are configured in an alternating order to generate a frequency determining sub-period, where generating the sub-period comprises charging a capacitive storage element from a first charging state to a second charging state. A runtime error on detection of the second charging state is compensated by precharging the capacitive storage element during a preceding sub-period to the first charging state being dependent on the runtime error.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

Figure 1:
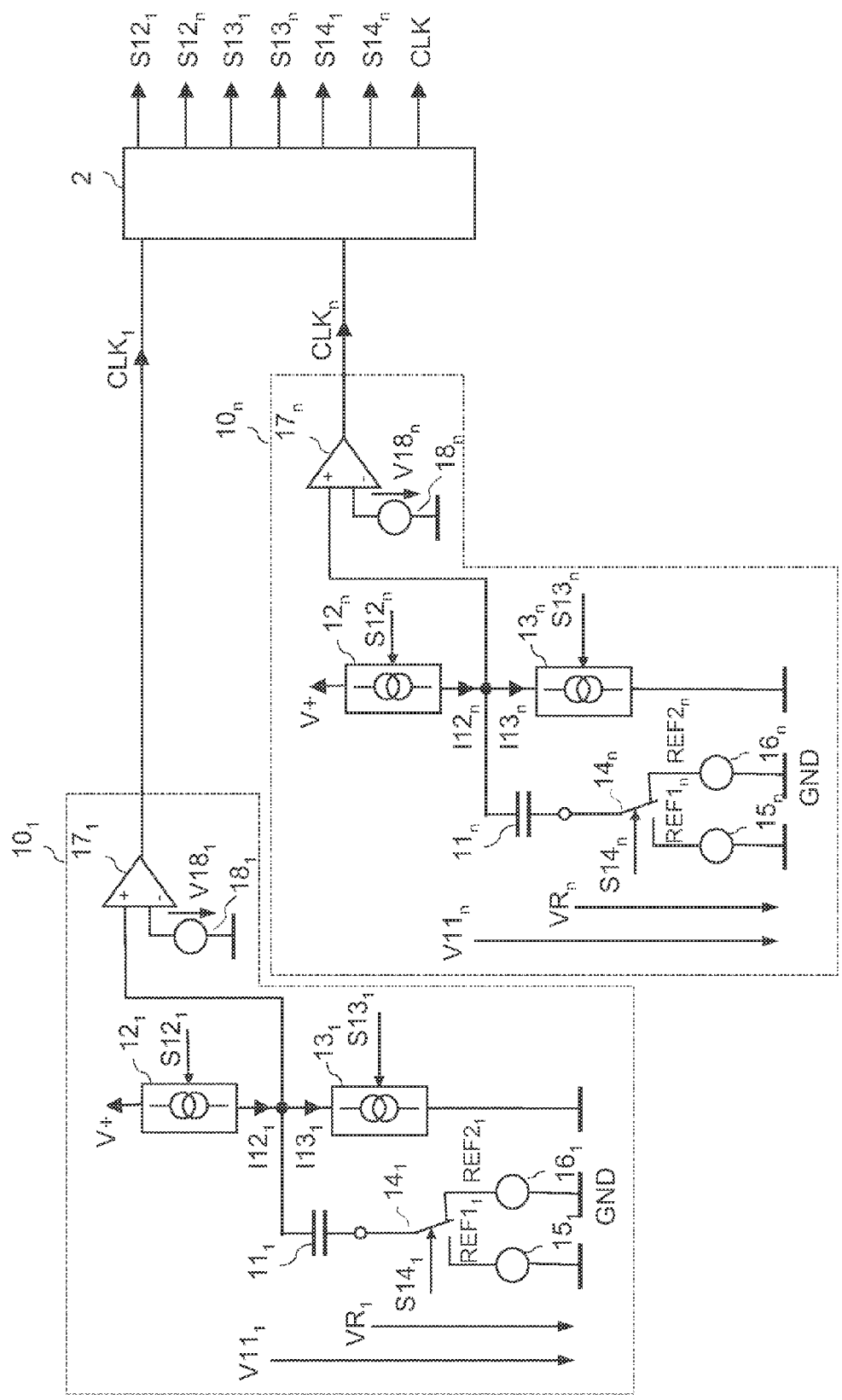
FIG. 1 illustrates a first embodiment of an oscillator circuit.

FIG. 1 illustrates a first embodiment of an oscillator circuit. The oscillator circuit includes a plurality of n, with n≥2, capacitive storage elements $11_1$, $11_n$, such as, for example, capacitors. The oscillator circuit of FIG. 1 includes n=2 capacitive storage elements. However, this is only an example. It is also possible to provide more than n=2 capacitive storage elements, which will be explained in further detail with reference to FIG. 10 herein below. The capacitive storage elements are, in particular, implemented such that they have a linear capacitance, which means that the voltage across each capacitive storage element increases linearly, when the charge stored in the capacitive storage element increases linearly. The capacitive charge storage elements can be implemented as conventional capacitors, such as plate capacitors, as a coupling capacitance between lines, or as a MOS capacitor.

Each of the capacitive storage elements $11_1$, $11_n$ is included in an oscillator unit $10_1$, $10_n$. The oscillator units $10_1$, $10_n$ each generate a clock sub-signal $CLK_1$, $CLK_n$ received by a control and output circuit 2. The control and output circuit 2 provides a clock signal CLK at an output and controls the operation of the individual oscillator units $10_1$, $10_n$ in a manner that will be explained in further detail herein below.

Each of the oscillator units $10_1$, $10_n$ includes a charging circuit $12_1$, $12_n$ connected to a first terminal of the corresponding capacitive storage element $11_1$, $11_n$. The charging circuits $12_1$, $12_n$ are controllable charging circuits that are controlled by control signals $S12_1$, $S12_n$ provided by the control and output circuit 2. The charging circuits $12_1$, $12_n$ can be activated and deactivated by their control signals $S12_1$, $S12_n$, wherein the charging circuits $12_1$, $12_n$ in the activated state provide a constant charging current other than zero to the corresponding capacitive storage element $11_1$, $11_n$, while in the deactivated state the charging current is zero. The charging circuits $12_1$, $12_n$ are each connected between a terminal for a supply potential V+ and the first terminal of the corresponding charge storage element $11_1$, $11_n$. The supply potential V+ can be the same for each of the charging circuits $12_1$, $12_2$. However, it is also possible to provide different supply potentials to individual the charging circuits $12_1$, $12_2$.

Figure 2:
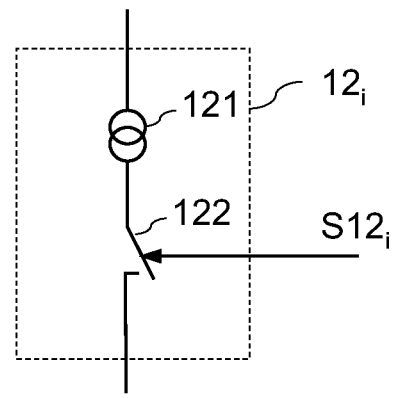
FIG. 2 illustrates an embodiment of a charging circuit.

Referring to FIG. 2, each of the charging circuits $12_1$, $12_n$ may be implemented with a constant current source 121 and a switch 122 connected in series with the current source 121, wherein the switch is switched on and off by the corresponding control signal $S12_1$, $S12_n$. In FIG. 2, charging circuit $12_i$ represents one of the charging circuits $12_1$, $12_n$ illustrated in FIG. 1, and control signal $S12_i$ represents the corresponding control signal $S12_1$, $S12_n$ illustrated in FIG. 1.

The capacitances of the individual capacitive storage elements $11_1$, $11_n$ can be equal or can be different. Further, the charging currents provided by the charging circuits $12_1$, $12_n$ can be equal or can be different. It should be noted, however, that exactly the same capacitances and exactly the same charging currents are difficult to realize since there are inevitable tolerances in the manufacturing process of the individual capacitive storage elements $11_1$, $11_n$ and charging circuits $12_1$, $12_n$. Thus, "equal" in this connection means differences in the capacitances and charging currents of up to 2% or even up to 5%.

Each of the oscillator units $10_1$, $10_n$ further includes a controllable discharge circuit $13_1$, $13_n$. The discharge circuits $13_1$, $13_n$ can be activated and deactivated by control signals $S13_1$, $S13_n$ provided by the control and output circuit 2. In the activated state the discharge circuits $13_1$, $13_n$ discharge the corresponding capacitive storage elements $11_1$, $11_n$. For this, the discharge circuits 13, $13_n$ are connected between the first terminal of the corresponding capacitive storage element $11_1$, $11_n$ and a terminal for a common reference potential GND, such as ground.

Figure 3:
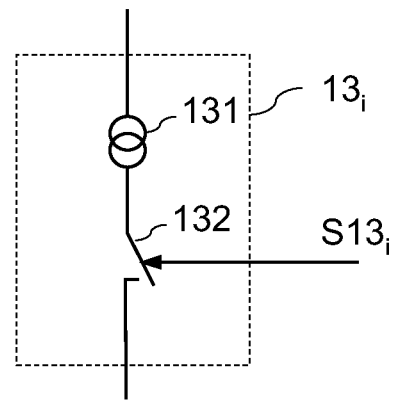
FIG. 3 illustrates a first embodiment of a discharging circuit.

FIG. 3 illustrates a first embodiment of the discharge circuits 13, $13_n$. The discharge circuit $13_i$ illustrated in FIG. 3 represents one of the discharge circuits $13_1$, $13_n$ of FIG. 1, and the control signal $S13_i$ in FIG. 3 represents one of the control signals $S13_1$, $S13_n$ of FIG. 1. Referring to FIG. 3, the discharge circuit $13_i$ can be implemented with a current source 131 and a switch 132 connected in series with the current source 131. The switch 132 is controlled by the control signal $S13_i$. The discharge circuit 13 is activated when the control signal $S13_i$ switches on the switch 132, and the discharge circuit $13_i$ is deactivated when the control signal $S13_i$ switches off the switch 132. In the activated state, the discharge circuit $13_i$ of FIG. 3 draws a discharge current from the corresponding capacitive storage element $11_1$, $11_n$, wherein the discharge current is defined by the current provided by the current source 131.

Figure 4:
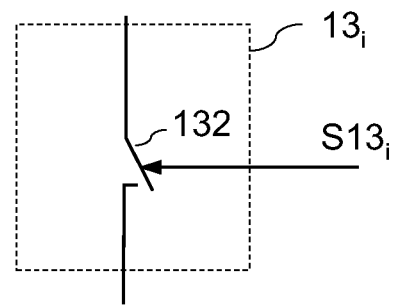
FIG. 4 illustrates a second embodiment of a discharging circuit.

FIG. 4 illustrates a further embodiment of a discharge circuit $13_i$. In this embodiment, the discharge circuit $13_i$ includes only the switch 132 controlled by the control signal $S13_i$. This type of discharge circuit is activated when the switch 132 is switched on (closed), and is deactivated when the switch 132 is switched off (opened). In the discharge circuit of FIG. 4, the discharge current drawn from the corresponding capacitive storage element $11_1$, $11_n$ is dependent on a potential difference between the electrical potential at the first terminal of the corresponding capacitive storage element $11_1$, $11_n$ and the reference potential GND, while in the discharge circuit of FIG. 3 the discharge current is defined by the current source 131.

It is possible to implement the discharge circuits $13_1$, $13_n$ differently. According to one embodiment, one of the discharge circuits $13_1$, $13_n$ is implemented as illustrated in FIG. 3, while another one of the discharge circuits is implemented as illustrated in FIG. 4.

Referring to FIG. 1, each of the oscillator units includes a terminal for a first reference potential $REF1_1$, $REF1_n$, and a terminal for a second reference potential $REF2_1$, $REF2_n$. Dependent on potential control signals $S14_1$, $S14_n$ provided by the control and output circuit 2 second terminals of the capacitive storage elements $11_1$, $11_n$ are either connected to the corresponding terminal for the first potential $REF1_1$, $REF1_n$, or to the corresponding terminal for the second reference potential $REF2_1$, $REF2_n$. For this, the oscillator units $10_1$, $10_n$ each include a switch $14_1$, $14_n$ coupled to the second terminal of the corresponding capacitive storage element $11_1$, $11_n$. Each of the switches is configured to switch the second terminal of the corresponding capacitive storage element $11_1$, $11_n$ between the terminal for the first reference potential $REF1_1$, $REF1_n$ and the terminal for the second reference potential $REF2_1$, $REF2_n$ controlled by the control signal $S14_1$, $S14_n$.

According to one embodiment, the first reference potential $REF1_1$, $REF1_n$ available at the first terminal in each of the oscillator units $10_1$, $10_n$ is higher than the second reference potential $REF2_1$, $REF2_n$ available at the second terminal. The first reference potentials $REF1_1$, $REF1_n$ are, for example, provided by first voltage sources $15_1$, $15_n$, wherein each of these first voltage sources is connected between one of the terminals for the first reference potential $REF1_1$, $REF1_n$ and common reference potential GND. The second reference potentials $REF2_1$, $REF2_n$ are, for example, provided by second voltage sources $16_1$, $16_n$ each connected between one of the terminals for the second reference potential $REF2_1$, $REF2_n$ and common reference potential GND. The second voltage sources $16_1$, $16_n$ are optional. When these second reference voltage sources $16_1$, $16_n$ are omitted, the second reference potentials $REF2_1$, $REF2_n$ of the individual oscillator units corresponds to the common reference potential GND.

Further, the oscillator units $10_1$, $10_n$ each include a threshold detector $17_1$, $17_n$ configured to compare the electrical potentials $V11_1$, $V11_n$ at the first terminals of the capacitive storage elements $11_1$, $11_n$, or the voltages $V11_1$, $V11_n$ between the first terminals and the common reference potential GND, with reference voltages $V18_1$, $V18_n$ provided by further reference voltage sources $18_1$, $18_n$. Each of the threshold detectors $17_1$, $17_n$ is, in particular, configured to detect when the electrical potential $V11_1$, $V11_n$ it monitors reaches the associated reference voltage $V18_1$, $V18_n$ and to provide an output signal that indicates when the monitored electrical potential $V11_1$, $V11_n$ reaches the associated reference voltage $V18_1$, $V18_n$. The clock sub-signals $CLK_1$, $CLK_n$ provided by the individual oscillator units $10_1$, $10_2$ are available at outputs of these threshold detectors $17_1$, $17_n$.

The threshold detectors $17_1$, $17_n$ can be implemented as comparators, as illustrated in FIG. 1. However, this is only an example. Each of the threshold detectors $17_1$, $17_n$ could also be implemented as Schmitt trigger, as inverter, or as an inverter chain with at least two inverters connected in series. In a Schmitt trigger or an inverter the reference voltage is internally generated, where the output signal of a Schmitt trigger or inverter changes each time, an input signal reaches the internally generated threshold.

The first reference potentials $REF1_1$, $REF1_n$ of the individual oscillator units $10_1$, $10_n$ can be different from each other, the second reference potentials $REF2_1$, $REF2_n$ of the individual oscillator units $10_1$, $10_n$ can be different from each other, and the reference voltages $V18_1$, $V18_n$ can be different from each other. However, this is only an example. According to another embodiment illustrated in FIG. 5, the individual oscillator units $10_1$, $10_n$ have a common first reference potential REF1 generated by a first reference potential source 15, have a common second reference potential REF2 generated by a second reference potential source 16, and have a common reference potential V18 generated by a common reference potential source 18.

The operating principle of the oscillator circuits illustrated in FIGS. 1 and 5 will now be explained with reference to FIG. 6. FIG. 6 illustrates timing diagrams of the voltage $V11_1$ at the first terminal of the first capacitive storage element $11_1$, the voltage $V11_n$ at the first terminal of the second capacitive storage element $11_n$, the voltage $VR_1$ at the second terminal of the first capacitive storage element $11_1$, and the voltage $VR_n$ at the second terminal of the second capacitive storage element $11_n$. These voltages are voltages referenced to the common reference potential GND. Further, FIG. 6 illustrates timing diagrams of charging current $I12_1$, $I12_n$ and of discharging currents $I13_1$, $I13_n$ of the first and second oscillator units $10_1$, $10_n$, respectively. Further, FIG. 6 illustrates timing diagrams of the first and second clock sub-signals $CLK_1$, $CLK_n$.

Figure 5:
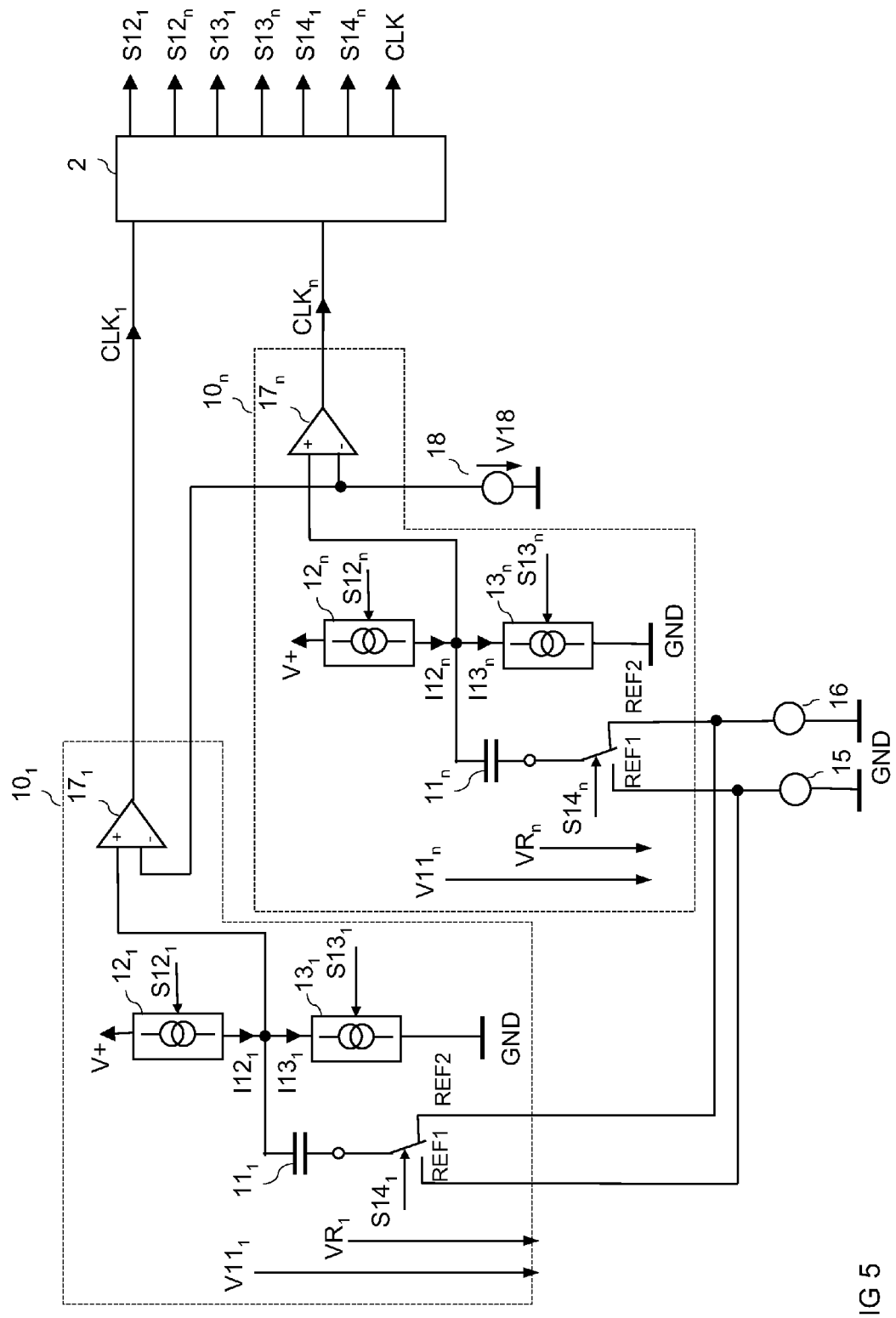
FIG. 5 illustrates a second embodiment of an oscillator circuit that is a modification of the oscillator circuit of FIG. 1.
Figure 6:
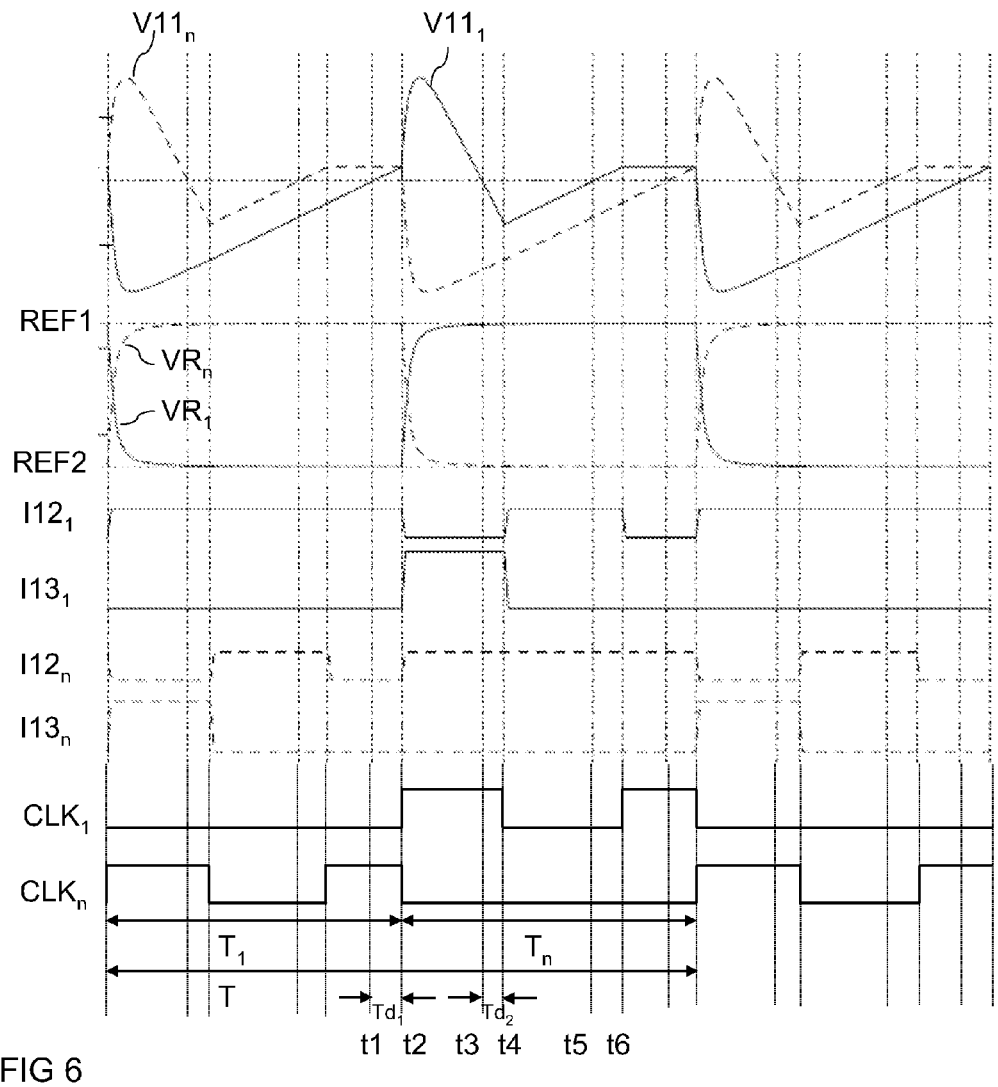
FIG. 6 shows timing diagrams illustrating the operating principle of the oscillator circuit of FIG. 5.

For explanation purposes it is assumed that, as illustrated in FIG. 5, the first reference potentials $REF1_1$, $REF1_n$ are equal, so that $REF1_1 = REF1_n = REF1$, that the second reference potential $REF2_1$, $REF2_n$ are equal, so that $REF2_1 = REF2_n = REF2$, and that the reference voltages $V18_1$, $V18_n$ are equal, so that $V18_1 = V18_n = V18$. However, the timing diagrams illustrated in FIG. 6 also representative of the operating principle of the oscillator circuit illustrated in FIG. 1, if mutually different first reference potentials $REF1_1$, $REF1_n$, mutually different second reference potentials $REF2_1$, $REF2_n$ and mutually different reference voltages $V18_1$, $V18_n$ are used.

In the method performed by the oscillator circuits illustrated in FIGS. 1 and 5 the clock signal CLK is generated such that it includes subsequent oscillation periods, with each oscillation period including at least n subsequent sub-periods. Each of these sub-periods is generated using one of the capacitive storage elements $11_1$, $11_n$. In FIG. 6, T denotes the duration of one period of the oscillator signal CLK, $T_1$ denotes the duration of the sub-period generated using the first capacitive storage element $11_1$, and $T_n$ denotes the duration of the sub-period generated using the second capacitive storage element $11_n$. Each of the first and second capacitive storage elements $11_1$, $11_n$ can assume a first charging state and a second charging state. The durations $T_1$, $T_n$ of the first and second sub-periods are those time periods that are required to change the charging state of the corresponding capacitive storage element $11_1$, $11_n$ from the first charging state as detected by the associated threshold detector $17_1$, $17_n$ to the second charging state as detected by the associated threshold detector $17_1$, $17_n$, wherein changing the charging state includes providing a fixed current to the corresponding capacitive storage element $11_1$, $11_n$ from the corresponding charging circuit $12_1$, $12_n$.

The operating principle of changing the charging state of the capacitive storage elements $11_1$, $11_n$ from the first charging state to the second charging state, and of setting back the charging state from the second charging state to the first charging state is the same for both capacitive storage elements $11_1$, $11_n$. In the following explanation, $11_i$ denotes one of the n capacitive storage elements $11_1$, $11_n$. Consequently, $REF1_i$ denotes the corresponding first reference potential, $REF2_i$ denotes the corresponding second reference potential, $VR_i$ denotes the voltage at the second terminal of the capacitive storage element $11_i$, and $V18_i$ denotes the corresponding threshold voltage, which will also be referred to as threshold detector reference potential in the following. For explanation purposes it is assumed that $REF1_i=REF1$, $REF2_i=REF2$, and $V18_i=V18$. In the following, $T_i$ denotes the duration of the sub-period generated using the capacitive storage element $11_i$.

The capacitive storage element $11_i$ is in the first charging state when the electrical potential $VR_i$ at the second terminal corresponds to the first reference potential $REF1_i$ and when the electrical potential $V11_i$ at its first terminal corresponds to the threshold detector reference potential $V18_i$ as detected by the corresponding threshold detector $17_i$.

Referring to FIG. 6, at the beginning of each of the sub-periods $T_i$ the electrical potential $VR_i$ at the second terminal of the capacitive storage element $11_i$ is switched from the first reference potential $REF1_i$ to the lower second reference potential $REF2_i$ so that the potential $V11_i$ at the first terminal rapidly decreases at the beginning of each sub-period. During the sub-period the electrical potential $V11_i$ at the first terminal then increases by virtue of the charging current $I12_i$ provided to the capacitive storage element $11_i$. In the embodiment illustrated in FIG. 6, the capacitive storage elements $11_1$, $11_n$ are driven such that they alternatingly change their charging states from the first charging state to the second charging state, so that as soon as one of the capacitive storage elements has reached its second charging state, the charging process of the other one of the capacitive storage elements starts. Consequently, one period T or clock cycle of the clock signal CLK includes two subsequent sub-periods $T_1$, $T_2$, wherein each of these sub-periods is defined by the charging process of one of the capacitive storage elements $11_1$, $11_2$.

After one of the capacitive storage elements $11_1$, $11_n$ has reached its second charging state, the charging state has to be set back to the first charging state before a new sub-period starts that is defined by this capacitive storage element. In the embodiment illustrated in FIG. 6, the charging state of each capacitive storage element $11_1$, $11_n$ is set back during the sub-period in which the other one of the capacitive storage elements is "active". A capacitive storage element is active when it changes its charging state from the first charging state to the second charging state. In the embodiment illustrated in FIG. 6, the first capacitive storage element $11_1$ is set back during the sub-period $T_n$ in which the second capacitive storage element $11_n$ is active, and the second capacitive storage element $11_n$ is set back during the sub-period $T_1$ in which the first capacitive storage element $11_1$ is active. Setting back the capacitive storage element $11_i$ from the second charging state to the first charging state includes: switching the reference potential $VR_i$ at the second terminal from the lower second reference potential $REF2_i$ to the higher first reference potential $REF1_i$; discharging the capacitive storage element $11_i$ until the electrical potential $V11_i$ at the first terminal reaches or falls below the threshold detector reference potential $V18_i$; and again charging the capacitive storage element $11_i$ using the charging current $I12_i$ until the electrical potential $V11_i$ at the first terminal reaches the threshold detector reference potential $V18_i$ as detected by the corresponding threshold detector $17_i$. This will be explained with reference to the first capacitive storage element $11_1$ which changes its charging state from the second charging state back to the first charging state during the sub-period $T_n$.

Referring to FIG. 6, the potential $VR_1$ at the second terminal of the capacitive storage element $11_1$ changes from the lower second reference potential $REF2_1=REF2$ to the higher first reference potential $REF1_1=REF1$ at the beginning of the sub-period $T_n$, so that the potential $V11_1$ at the first terminal rapidly increases. By virtue of the discharging current $I13_1$ the potential $V11_1$ at the first terminal then decreases until this potential reaches or falls below the threshold detector reference potential $V18_1=V18$. After the potential $V11_1$ at the first terminal has reached or fallen below the threshold detector reference potential $V18_1$, the first capacitive storage element $11_1$ is again charged using the charging current $I12_1$ until the voltage $V11_1$ at the first terminal reaches the threshold detector reference potential $V18_1$ as detected by the threshold detector $17_1$. When the potential $V11_1$ at the first terminal reaches the threshold detector reference potential $V18_1$ the charging current $I12_1$ stops. This charging current $I12_1$ again starts to flow at the beginning of the next sub-period $T_1$ in which the first capacitive storage element $11_1$ changes its charging state from the first charging state to the second charging state in order to define the sub-period $T_1$ or, more exactly, in order to define the duration $T_1$ of the sub-period.

Referring to FIG. 6, there are time delays between those times at which the potential $V11_i$ at the first terminal of one capacitive storage element $11_i$ reaches the threshold detector reference potential $V18_i$ and those time periods at which a corresponding clock sub-signal $CLK_i$ changes its signal level. Those delay times occur when the capacitive storage element $11_i$ changes its charging state from the first charging state to the second charging state, and when the capacitive storage element $11_i$ is again set back to the first charging state. These delay times will be explained with reference to those delay times occurring during charging and discharging processes of the first capacitive storage element $11_1$. In the first sub-period $T_1$ defined by the first capacitive storage element, the potential $V11_1$ reaches the threshold detector reference potential $V18_1$ at a first time t1, while the first clock sub-signal $CLK_1$ at the output of the first threshold detector $17_1$ changes its signal level indicating that the potential $V11_1$ has reached the threshold detector reference potential at a later time t2. A time difference $Td_1$ between the first and second times t1, t2 is due to propagation delays or run-times in the first threshold detector $17_1$. This propagation delay can be dependent on different factors, such as variation in the manufacturing process of the threshold detector, or external factors, such as the ambient temperature. While this propagation delay may vary during the lifetime of the threshold detector, it can be assumed that the propagation delay is constant within one clock cycle of the clock signal CLK.

The propagation delay $Td_1$ occurring in the first sub-period $T_1$ has the effect that the potential $V11_1$ at the first terminal of the first capacitive storage element $11_1$ is above the threshold detector reference potential $V18_1$ at the end of the first sub-period. In the second sub-period $T_n$, when the charging state of the first capacitive storage element $11_1$ is set back from the second charging state to the first charging state the propagation delay of the threshold detector $17_1$ occurs twice, a first time, when the capacitive storage element $11_1$ is discharged, and a second time, then this first capacitive storage element $11_1$ is again charged. At a third time t3 the decreasing potential $V11_1$ reaches the threshold detector reference potential $V18_1$, while due to a propagation delay of the threshold detector $17_1$ the output signal $CLK_1$ of the first threshold detector changes its signal level at a fourth time t4. A time difference between the third and fourth times t3, t4 corresponds to the propagation delay $Td_2$ of the threshold detector $17_1$. Dependent on the type of threshold detector that is used, the propagation delay $Td_1$ (between t1 and t2) that occurs when the potential $V11_1$ rises above the threshold $V18_1$ can be different from the propagation delay that occurs when the potential $V11_1$ falls below the threshold $V18_1$. The propagation delay $Td_1$ occurring at a rising edge of the waveform of the potential $V11_1$ will, therefore, be referred to as first propagation delay in the following, while the propagation delay occurring at a falling edge of the waveform of the potential $V11_1$ will, therefore, be referred to as second propagation delay $Td_2$ in the following.

Later, in the second sub-period $T_n$, when the first capacitive storage element $11_1$ is charged, the potential $V11_1$ reaches the threshold detector reference potential $V18_1$ at a fifth time t5, while the output signal $CLK_1$ of the first threshold detector $17_1$ changes is signal level at a sixth time t6. A delay time between the fifth and sixth times t5, t6 correspond to the first propagation delay $Td_1$ of the first threshold detector $17_1$. A slope of the rising edge of the waveform of the potential $V11_1$ is equal at times t1 and t5.

Although there are propagation delays in the threshold detectors $17_1$, $17_n$, these propagation delays do not influence the durations of the sub-periods $T_1$, $T_n$ and do, therefore, not influence the frequency f of the clock signal CLK, with $f=1/T=1/(T_1+T_n)$. In the following, the duration $T_1$ of the first sub-period will be derived. From this it will be seen that the duration $T_1$ of the first sub-period is independent of the propagation delay of the first threshold detector $17_1$. It should be noted that anything which will be explained with reference to the first sub-period $T_1$ applies to the second sub-period $T_n$ accordingly.

Referring to FIG. 6, the first clock-sub-signal $CLK_1$ indicates at time t2 that the first capacitive storage element $11_1$ has reached its second charging state. At this time a charge Q2 has been stored in the first capacitive storage element $11_1$, where:

$$Q2 = C11_1 \cdot (V18_1 - REF2_1) + Td_1 \cdot I12_1 \quad (1),$$

where $C11_1$ is the capacitance of the first capacitive storage element, $V18_1$ is the threshold detector reference potential, $REF2_1$ is the second reference potential, $Td_1$ is the propagation delay of the first threshold detector, and $I12_1$ is the first charging current. In equation (1), $C11_1 \cdot (V18_1 - REF2_1)$ denotes the charge stored in the first capacitive storage element $11_1$ when the voltage across the capacitive storage element $11_1$ is equal to $V18_1 - REF2_1$, and $Td_1 \cdot I12_1$ denotes the charge that additionally flows into the capacitive storage element $11_1$ during the propagation delay of the first threshold detector $17_1$. When the first capacitive storage element $11_1$ is in the first charging state, a charge Q1 has been stored in the first capacitive storage element $11_1$, where:

$$Q1 = C11_1 \cdot (V18_1 - REF1_1) + Td_1 \cdot I12_1 \quad (2),$$

where $REF1_1$ is the first reference potential. In equation (2), $C11_1 \cdot (V18_1 - REF1_1)$ is the charge stored in the first capacitive storage element $11_1$ when the voltage across the capacitive storage element $11_1$ is equal to $V18_1 - REF1_1$, and $Td_1 \cdot I12_1$ is the electrical charge that additionally flows into the first capacitive storage element $11_1$ during the propagation delay of the threshold detector $17_1$ after the potential $V11_1$ at the first terminal of the capacitive storage element $11_1$ has reached a threshold detector reference potential $V18_1$. In the timing diagram of FIG. 6, the time when the additional charge is stored in the first capacitor storage element $11_1$ is the time between t5 and t6.

In order to change the charging state of the first capacitive storage element $11_1$ from the first charging state as detected by the first threshold detector $17_1$ to the second charging state as detected by the first threshold detector $17_1$, a charge difference $\Delta Q$ has to be stored in the first capacitive storage element $11_1$. This charge difference is provided by charging the first capacitive storage element $11_1$ with constant charging current $I12_1$ during the time period $T_1$, so that $$\Delta Q = Q2 - Q1 = T_1 \cdot I12_1 \quad (3).$$

Using equations (1)-(3) the duration $T_1$ of the first sub-period can be expressed as:

$$T_1 \frac{[C11_1 \cdot (V18_1 - REF2_1) + Td_1 \cdot I12_1] - [C11_1 \cdot (V18_1 - REF1_1) + Td_1 \cdot I12_1]}{I12_1} = \frac{C11_1 \cdot (REF1_1 - REF2_1)}{I12_1}. \quad (4)$$

From equation (4) it can be seen that the duration $T_1$ of the first sub-period is only dependent on the capacitance $C11_1$ of the first capacitive storage element $11_1$, of the first and second reference potentials $REF1_1$, $REF2_1$, and of the charging current $I12_1$.

Consequently, the duration $T_n$ of the second sub-period can be expressed as:

$$T_n = \frac{C11_n \cdot (REF2_n - REF1_n)}{I12_n}. \quad (5)$$

Thus, the duration $T_n$ of the second sub-period is only dependent on the capacitance $C11_n$ of the second capacitive storage element $11_n$, of the first and second reference potentials $REF1_n$, $REF2_n$ of the second oscillator circuit, and of the second charging current $I12_n$. The duration T of one clock cycle of the clock signal CLK equals the sum of the two sub-periods, i.e.: $T=T_1+T_n$.

Referring to equations (4) and (5) the durations of the individual sub-periods are independent of threshold detector reference potentials and are also independent of the discharging currents $I13_1$, $I13_n$.

Figure 7:
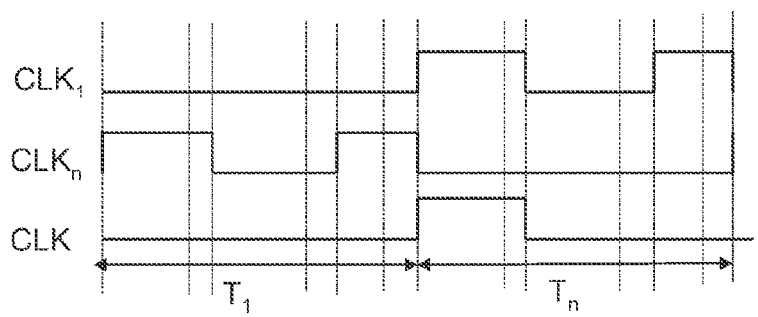
FIG. 7 shows timing diagrams illustrating the operating principle of an output circuit according to a first embodiment.

The clock signal CLK can be generated from the first and second clock sub-signals in many different ways. According to one embodiment, the clock signal CLK is derived from only one of the clock sub-signals and has a rising edge each time the rising edge of the corresponding sub-signal occurs at the end of the sub-period. FIG. 7 illustrates a timing diagram of a clock signal CLK derived from the first sub-signal $CLK_1$. Referring to FIG. 6, clock signal CLK has a rising edge or clock pulse at the end of each first sub-period $T_1$. The duration of the clock pulse is arbitrary. In the embodiment illustrated in FIG. 7, the clock pulse of the clock signal CLK corresponds to the pulse of the first sub-signal $CLK_1$ occurring after the end each first sub-period $T_1$.

Figure 8:
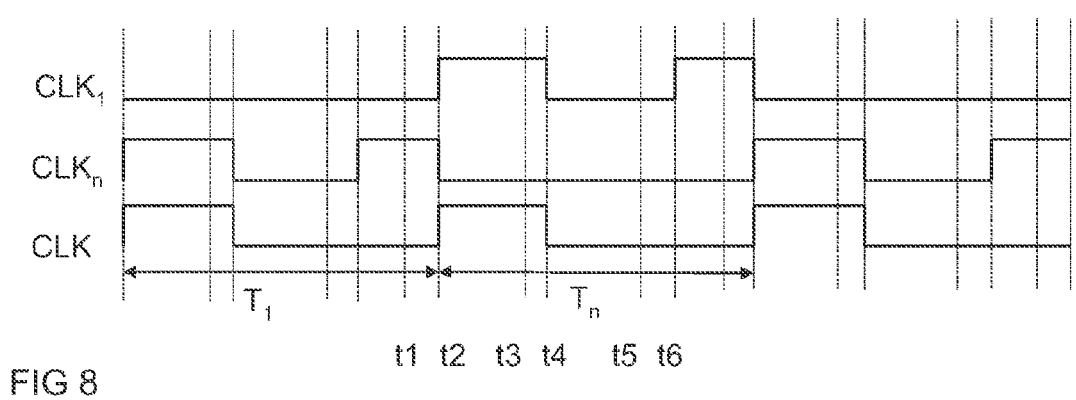
FIG. 8 shows timing diagrams illustrating the operating principle of an output circuit according to a second embodiment.

According to another embodiment, illustrated in FIG. 8, the clock signal CLK has a clock pulse in each of the sub-periods. In this case, if the first and second sub-periods $T_1$, $T_n$ are not equal, the durations between two subsequent clock pulses are different. However, the mean frequency, which is given as $2/(T_1+T_n)$ and which can be calculated using equations (4) and (5) is constant. In many applications, a varying time difference between subsequent clock pulses can be tolerated as long as the mean frequency is constant.

Figure 9:
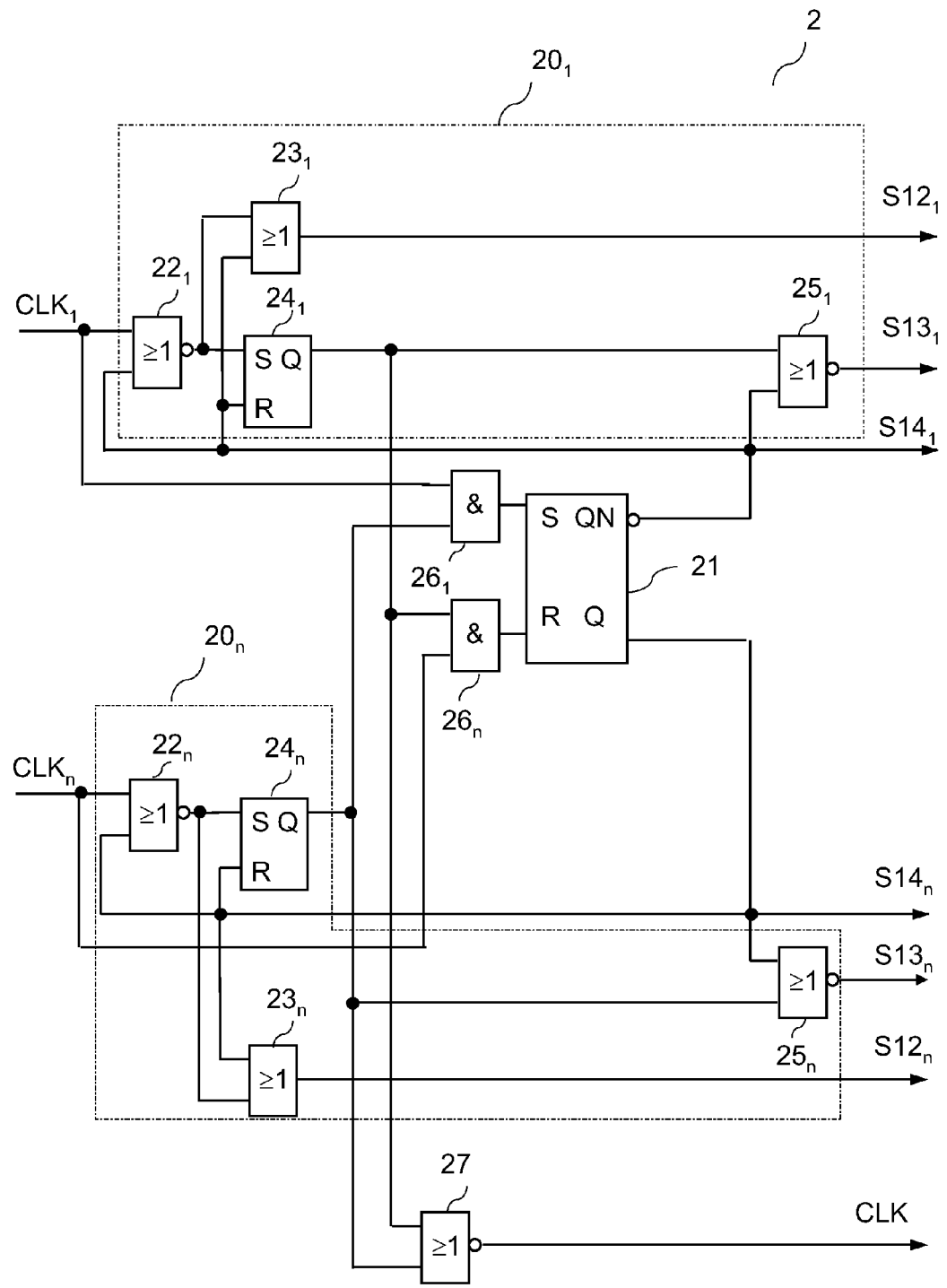
FIG. 9 illustrates an embodiment of an output circuit of the oscillator circuits of FIGS. 1 and 2.

FIG. 9 illustrates one embodiment of the control and output circuit 2, that receives the clock sub-signals $CLK_1$, $CLK_n$ and that generates the clock signal CLK, the control signals $S12_1$, $S12_n$ for the charging circuits $12_1$, $12_n$, the control signals $S13_1$, $S13_n$ for the discharging circuits $13_1$, $13_n$ and the control signals $S14_1$, $S14_n$ for setting the reference potentials at the second terminals of the capacitive storage elements. The control circuit 2 illustrated in FIG. 9 generates the clock signal CLK in accordance with the timing diagram illustrated in FIG. 8.

The control circuit 2 includes an output flip-flop 21 having a first output terminal QN and a second output terminal Q, where in the present example the first output terminal QN is an inverting output terminal and the second output terminal Q is a non-inverting output terminal. The potential control signal $S14_1$ of the first oscillator unit is available at the first output QN and the potential control signal S14n of the second oscillator unit is available at the second output Q of the flip-flop 21. Thus, these two potential control signals $S14_1$, $S14_n$ have complementary signal levels so that when the electrical potential at the second terminal of one of the capacitive storage elements $11_1$, $11_n$ is the first potential, then the electrical potential at the second terminal of the other capacitive storage elements is second reference potential.

The control signals $S12_1$, $S12_n$ for the charging circuits and the control signal $S13_1$, $S13_n$ of the discharging circuits are generated dependent on the clock-sub-signals $CLK_1$, $CLK_n$ the potential control signals $S14_1$, $S14_n$. The control circuit 2 includes first and second logic units $20_1$, $20_n$ that generate these control signals $S12_1$, $S12_n$, $S13_1$, $S13_n$. Each of these logic units $20_1$, $20_n$ includes a nor-gate $22_1$, $22_n$ at its input. The nor-gate $22_1$ of the first unit $20_1$ receives a first clock-sub-signal $CLK_1$ and a first potential control signal $S14_1$ and the nor-gate $22_n$ of the second unit $20_n$ receives the second clock-sub-signal $CLK_n$ and the second potential control signal $S14_n$. The output signal of each of these nor-gates $22_1$, $22_n$ is received at the set-input of a flip-flop $24_1$, $24_n$ where an output signal of each flip-flop $24_1$, $24_n$ together with a potential control signal $S14_1$, $S14_n$ defining one control signal $S13_1$, $S13_n$ of one discharging unit. The control unit $S13_1$ of the first discharging unit $13_1$ is available at the output of a further nor-gate $25_1$ that receives the output signal of the flip-flip $24_1$ at a first input and the first potential control signal $S14_1$ at a second input. The control signal $S13_n$ of the second discharging unit $13_n$ is available at the output of a nor-gate $25_n$ that receives the output signal of the flip-flop $24_n$ at a first input and the second potential control signal $S14_n$ at a second input.

The flip-flops $24_1$, $24_n$ are reset by the corresponding potential control signal $S14_1$, $S14_n$.

The control signals $S12_1$, $S12_n$ of the charging circuits $12_1$, $12_n$ are available at outputs of or-gates $23_1$, $23_n$. Each of these or-gates $23_1$, $23_n$ receives the output signal of the input nor-gate $22_1$, $22_n$ at a first input and the potential control signal $S14_1$, $S14_n$ at a second input.

The clock signal CLK is available at the output of a further nor-gate 27 that receives the output signal of the flip-flop $24_1$ of the first unit $20_1$ at a first input and the output signal of the flip-flop $24_n$ of the second unit $20_n$ at a second input.

The output flip-flop 21 is set dependent on the first clock-sub-signal $CLK_1$ and the output signal of the flip-flop $24_n$ of the second unit $20_n$. These signals are AND-connected by a first AND-gate $26_1$. The output flip-flop 21 is reset dependent on the second clock-sub-signal $CLK_n$ and the output signal of the flip-flop $24_1$ of the second unit $20_1$. These signals are AND-connected by a second AND-gate $26_n$.

It should be noted that implementing the control circuit 2 as illustrated in FIG. 9 is only an example. It will be appreciated by the one skilled in the art that the same functionality provided by the control circuit 2 illustrated in FIG. 9 may also be implemented by other logic circuit.

Referring to what has been explained hereinbefore, the control and output circuit 2 is configured to alternatingly change the charging state of the capacitive storage elements $11_1$, $11_n$ from the first charging state to the second state by providing a constant charging current $I12_1$, $I12_n$, wherein the time required to change the charging state of one capacitive storage element defines one of the sub-periods $T_1$, $T_n$. In the sub-period in which one capacitive storage element is active, the charging state of the other capacitive storage element is set back from the second charging state to the first charging state by discharging the capacitive storage element to below the first charging state and then again charging the capacitive storage element using the constant charging current.

The oscillator circuits explained herein before each include two oscillator units $10_1$, $10_n$ each including one capacitive storage element $11_1$, $11_n$, wherein these capacitive storage elements are alternatingly activated in order to generate clock sub-signals $CLK_1$, $CLK_n$ from which the clock signal CLK is generated. Consequently, the method explained herein before includes generating each period or clock cycle of the clock signal CLK such that each period T includes two sub-periods $T_1$, $T_n$ or only one sub-period, wherein each of these sub-periods is generated using one capacitive storage element $11_1$, $11_n$. It should be noted, however, that having an oscillator circuit with n=2 oscillator is only an example. Any number n>2 of oscillator units may be used as well.

Figure 10:
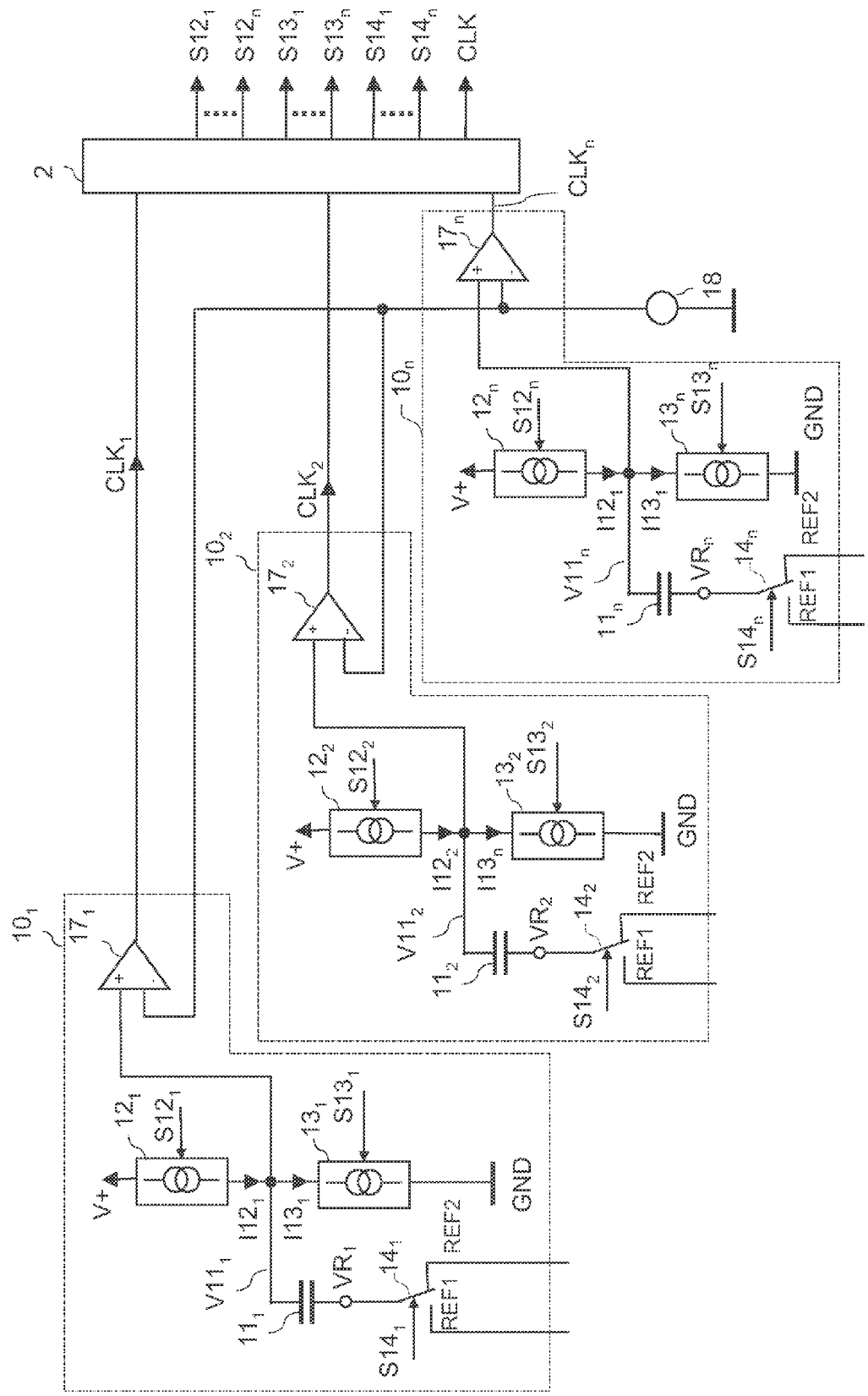
FIG. 10 illustrates a further embodiment of an oscillator circuit.

FIG. 10 illustrates an exemplary embodiment of an oscillator circuit which includes n=3 oscillator units $10_1$, $10_2$, $10_n$. Each of these oscillator units is implemented as one of the oscillator units shown in FIG. 5 and includes a capacitive storage element $11_i$, a charging circuit $12_i$, a discharging circuit $13_i$ and a circuit $14_i$ for varying the reference potential $VR_i$ at the second terminal of the capacitive storage element $11_i$. Each of these oscillator units $10_1$, $10_2$, $10_n$ generates a clock sub-signal $CLK_1$, $CLK_2$, $CLK_n$ received by the control and output circuit 2. The control and output circuit 2 generates the control signals $S12_i$ for the charging circuits $12_i$, the control signals $S13_i$ for the discharging circuits $13_i$, and the control signals $S14_i$ for changing the reference potential at the second terminals of the capacitive storage elements $11_i$.

Figure 11:
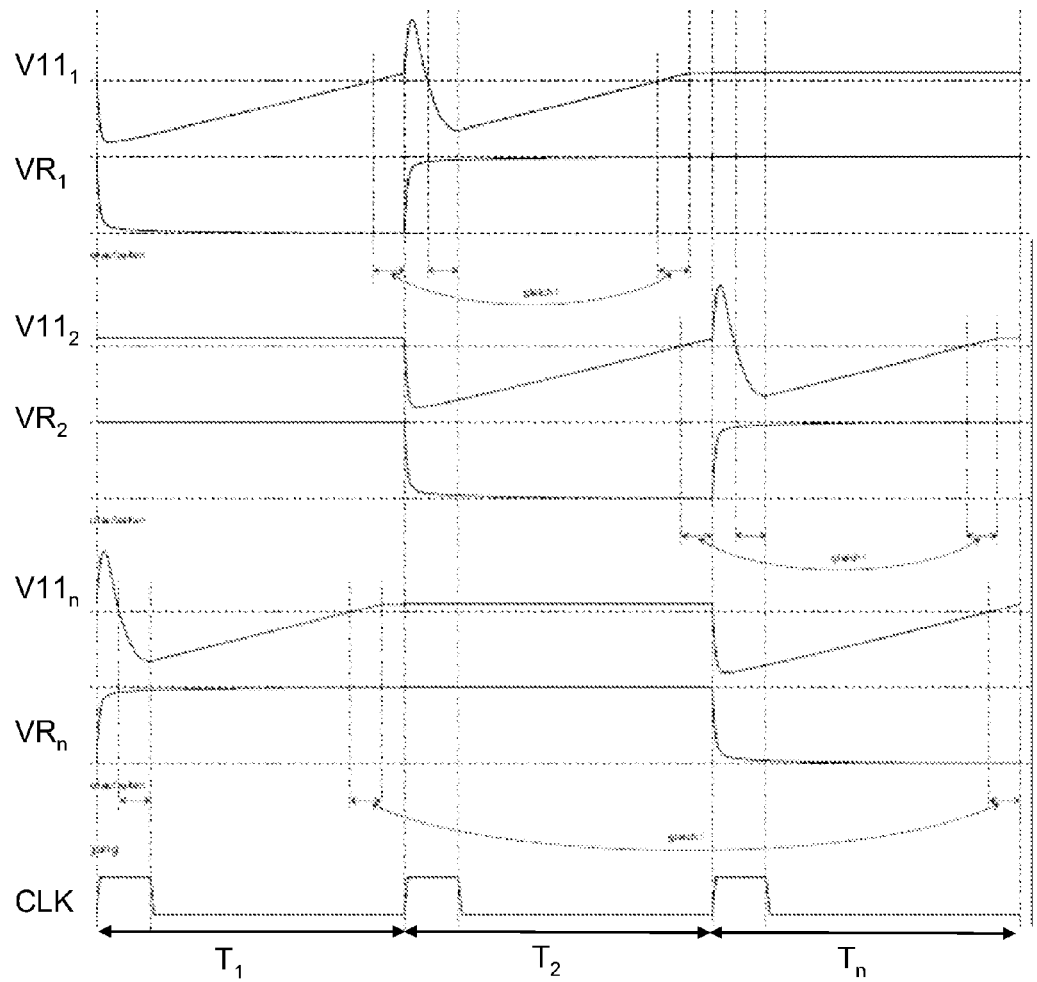
FIG. 11 shows timing diagrams illustrating the operating principle of the oscillator circuit of FIG. 10.

The operating principle of the oscillator circuit illustrated in FIG. 10 will be explained with reference to FIG. 11, in which timing diagrams of the electrical potentials $V11_i$ at the first terminals of the capacitive storage elements $11_i$, of the reference potentials $VR_i$ at the second terminals of the capacitive storage elements $11_i$, of the clock sub-signals $CLK_i$ and of the clock signal CLK are illustrated. Referring to FIG. 10 the individual capacitive storage elements $11_i$ are activated in a given order within one clock cycle of the clock signal CLK. In the embodiment illustrated in FIG. 10, this given order is: $11_1$-$11_2$-$11_n$-$11_1$-$11_2$- . . . , so that each clock cycle of the clock signal CLK includes a sequence $T_1$-$T_2$-$T_n$-$T_1$-$T_2$- of sub-periods, wherein each of these sub-periods is generated by changing the charging state of one of the capacitive storage elements $11_i$ from a first charging state to a second charging state by providing a constant charging current $I12_i$. In those time periods in which one capacitive storage element is not active, the charging state of this capacitive storage element is set back from the second charging state to the first charging state by discharging the capacitive storage element to below the first charging state and then charging the capacitive storage element to the first charging state by providing the constant charging current. In the oscillator circuit according to FIG. 10 setting back the charging state of one capacitive storage element may take longer than in the embodiments illustrated in FIGS. 1 and 5, because in the oscillator circuit of FIG. 10 setting back the charging state of one capacitive storage element may take two sub-periods of the other two capacitive storage elements, while in the embodiments of FIGS. 1 and 5 setting back one capacitive storage element may take only one sub-period. A clock signal CLK can be generated such that it includes only one clock pulse within one clock cycle T, or that it includes a clock pulse within each sub-period or sub-cycle. In the latter case a time distance between two subsequent clock pulses may vary due to different durations of the individual sub-periods $T_1$, $T_2$, $T_n$. However, a mean frequency which is given as $3/(T_1+T_2+T_n)$ is constant and is independent of propagation delays of the threshold detectors $17_1$, $17_2$, $17_n$.

It should be noted that it is not necessary to activate the individual capacitive storage elements in the same order in each clock cycle of the clock signal CLK. It is also possible to change the order in which the individual capacitive storage elements are activated within one clock cycle. Further, it is not necessary to activate each capacitor storage element only once within one clock cycle of the clock signal CLK. According to one embodiment it is also possible to activate at least one of the capacitive storage elements more than once within each clock cycle T of the clock signal CLK.

In the embodiments explained hereinbefore, each oscillator unit 10, includes one threshold detector that provides the clock sub-signal. However, this is only an example. According to another embodiment (not illustrated) there are less threshold detectors than capacitive storage elements, so that at least two capacitive storage elements "share" one threshold detector, wherein each capacitive storage element has a threshold detector assigned thereto that detects when the capacitive storage element has reached the first or second charging state. This is, in particular, useful in oscillators which include n=3 or more oscillator units. This will briefly be explained. Referring to what has been explained hereinbefore, a threshold detector is required to detect when the assigned capacitive storage element has reached the second charging state in the active state and to detect when the capacitive storage element has been set back to the first charging state in a time period when one of the other capacitive storage elements is active. Assume that because of the presence of n=3 or more capacitive storage elements, there is a long time period between one capacitive storage element reaching its first charging state and the next time when this capacitive storage element becomes active. During this time period the threshold detector assigned to this capacitive storage element can be used to detect the charging states of another capacitive storage element.

In the embodiments explained hereinbefore, changing the charging state of any one of the capacitive storage elements $11_i$ from the first charging state to the second charging state includes providing a charging current to the capacitive storage element so as to charge the capacitive storage element. In this case, there is more electrical charge stored in the capacitive storage element in the second charging state than in the first charging state. However, this is only an example. It is also possible to implement the method such that there is less charge stored in the capacitive storage element $11_i$ in the second state than in the first state. In this case, the second reference potential $REF2_i$ is lower than the first reference potential $REF1_i$. Changing the charging state of the capacitive storage element from the first charging state to the second charging state includes: applying the second reference potential $REF2_i$ and discharging the capacitive storage element with a constant discharging current, which is equivalent to providing a constant negative charging current, to the capacitive storage element until the voltage $V11_i$ reaches the threshold detector reference potential $V18_i$. Changing the charging state from the second charging state to the first charging state includes: applying the first reference potential $REF1_i$, and charging the capacitive storage element with a charging current, which is equivalent to providing a negative discharging current, to the capacitive storage element until the voltage $V11_i$ reaches the threshold detector reference potential; and providing the constant charging current (constant negative discharging current) until the voltage $V11_i$ reaches the threshold detector reference threshold.

In the oscillators explained before, the threshold detector reference potential is constant, but the reference potential at the second terminals of the capacitive storage elements $11_1$, $11_n$ is variable such that this reference potential may assume a first or a second reference value. However, this is only one of several possible examples. According to another example, not shown, the reference potential at the second terminal is fixed, but the threshold detector reference potential is variable in order to detect the first or second charging state.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for generating periodic signal, the method comprising: providing a plurality of n capacitive storage elements, wherein n is an integer greater than or equal to 2, and wherein each capacitive storage element contains a first amount of charge in a first charging state and a second amount of charge in a second charging state; and providing at least two separate threshold detector circuits, with each capacitive storage element having one threshold detector circuit associated thereto, and with each threshold detector circuit being connected to detect a charging state of at least one associated capacitive storage element; generating one period of the periodic signal such that the period includes at least n subsequent sub-periods, wherein generating each sub-period comprises: changing the charging state of the at least one capacitive storage element from the first charging state to the second charging state when the associated threshold detector circuit detects that the first charging state has been reached, wherein changing the charging state comprises providing a constant charging current to the at least one capacitive storage element, and setting back the charging state of the at least one capacitive storage element to the first charging state from the second charging state after the sub-period when the associated threshold detector circuit detects that the second charging state has been reached.

2. The method of claim 1, wherein setting back the charging state of the at least one capacitive storage element to the first charging state comprises: discharging the at least one capacitive storage element to below the first charging state; and charging the at least one capacitive storage element using the constant charging current until the at least one capacitive storage element reaches the first charging state.

3. The method of claim 1, wherein detecting the charging state of the at least one capacitive storage element comprises evaluating a voltage across the at least one capacitive storage element.

4. The method of claim 1,
wherein each capacitive storage element comprises a first terminal and a second terminal, and
wherein detecting the charging state of the at least one capacitive storage element comprises evaluating a voltage at the first terminal or the second terminal, or evaluating a voltage between the first and second terminals of the at least one capacitive storage element.

5. The method of claim 4, wherein evaluating the charging state comprises comparing a voltage at one of the first and second terminals with a threshold detector reference voltage, or a voltage across the at least one capacitive storage element with a threshold voltage.

6. The method of claim 4, further comprising:
applying a first reference voltage to the second terminal of the at least one capacitive storage element when setting back the charging state of the at least one capacitive storage element from the first charging state to the second charging state; and
applying a second reference voltage to the second terminal of the at least one capacitive storage element when changing the charging state from the second charging state to the first charging state.

7. The method of claim 6,
wherein the first reference voltage is higher than the second reference voltage, and
wherein the charging current is a positive current.

8. The method of claim 6,
wherein the first reference voltage is lower than the second reference voltage, and
wherein the charging current is a negative current.

9. The method of claim 6, wherein setting back the charging state of the at least one capacitive storage element to the first charging state comprises: discharging the at least one capacitive storage element until a voltage at the one of the first and second terminals reaches a threshold detector reference voltage or until a voltage across the at least one capacitive storage element reaches a threshold voltage as detected by an associated threshold detector; and charging the at least one capacitive storage element using the constant charging current until the voltage at the one of the first and second terminals reaches the threshold detector reference voltage or until the voltage across the at least one capacitive storage element reaches the threshold voltage as detected by the associated threshold detector.

10. The method of claim 1, wherein setting back the charging state of the at least one capacitive storage element to the first charging state after the sub-period comprises that there is a time difference between a time when setting back the charging state is completed and a beginning of a new sub-period in which the charging state of the at least one capacitive element is changed from the first charging state to the second charging state.

11. The method of claim 10, wherein the charging state of the at least one capacitive storage element remains unchanged during the time difference.

12. The method of claim 1, wherein a clock signal is generated such that it includes a signal pulse in each sub-period.

13. The method of claim 1, wherein a clock signal is generated such that it includes one signal pulse within one period.

14. The method of claim 1 wherein n=2 or n=3.

15. The method of claim 1, wherein: the charging state of the one capacitive storage element is detected by the associated threshold detector via a first terminal of the at least one capacitive storage element; setting back the charging state comprises applying a first reference voltage to a second terminal of the at least one capacitive storage element; and changing the charging state further comprises applying a second reference voltage to the second terminal of the at least one capacitive storage element.

16. A method for generating an oscillating signal having subsequent oscillator signal periods, the method comprising:
providing n oscillator units, wherein n is an integer greater than two, wherein each of the oscillator units is configured to alternately assume an active mode and a preset mode, has an internal state that can assume a first state and a second state, has an internal runtime and comprises a capacitive storage element;
generating one oscillator signal period of the oscillator signal as a sequence of at least n sub-periods, each sub-period having a sub-period duration defined by one oscillator unit in the active mode, where a duration of two directly subsequent sub-periods are defined by two different oscillator units;
wherein each oscillator unit is configured to change its internal state from the first state to the second state in the active mode, and is preset to the first state in the preset mode,
wherein the first state and the second state is defined by a charging state of a corresponding capacitive storage element, with the charging state being defined by an amount of electrical charge stored in the capacitive storage element,
wherein the capacitive storage element is charged at a first terminal in the active mode, and a voltage applied to a second terminal of the capacitive storage element is changed when the oscillator unit transitions from the preset mode to the active mode, and
wherein the capacitive storage element in the first state and in the second state comprises a same offset charge that is dependent on the internal runtime, so that a charge difference between an amount of charge stored in the capacitive storage element in the first state and an amount of charge stored in the capacitive storage element in the second state is independent on the internal runtime.

17. The method of claim 16, further comprising generating an edge of a clock signal at an end of a sub-period.

18. The method of claim 16, wherein n=2 or n=3.

19. A method for generating a time duration of one sub-clock signal of a clock signal, the method comprising:
precharging a capacitive storage element at a first terminal of the capacitive storage element until a threshold detector detects that a voltage at a first terminal of the capacitive storage element has crossed a threshold, and stop charging the capacitive storage element when the threshold detector detects that the voltage at the first terminal of the capacitive storage element has crossed a first threshold;
continue charging the capacitive storage element at a first terminal of the capacitive storage element, and changing a voltage at a second terminal of the capacitive storage element when a time interval for generating a sub-clock begins; and
terminating the sub-clock when the threshold detector detects that the voltage at the first terminal of the capacitive storage element has crossed the threshold.

20. An oscillator circuit, comprising:
n oscillator units, wherein n is an integer greater than two, wherein each of the oscillator units is configured to alternately assume an active mode and a preset mode, has an internal state that can assume a first state and a second state, has an internal runtime and comprises a capacitive storage element;
wherein the oscillator circuit is configured to generate one oscillator signal period of an oscillator signal as a sequence of at least n sub-periods, each sub-period having a sub-period duration defined by one oscillator unit in the active mode, where a duration of two directly subsequent sub-periods are defined by two different oscillator units;
wherein each oscillator unit is configured to change its internal state from the first state to the second state in the active mode, and is preset to the first state in the preset mode, and
wherein the first state and the second state is defined by a charging state of a corresponding capacitive storage element, with the charging state being defined by an amount of electrical charge stored in the capacitive storage element,
wherein the capacitive storage element is charged at a first terminal in the active mode, and a voltage applied to a second terminal of the capacitive storage element is changed when the oscillator unit transitions from the preset mode to the active mode,
wherein the capacitive storage element in the first state and in the second state comprises a same offset charge that is dependent on the internal runtime, so that a charge difference between an amount of charge stored in the capacitive storage element in the first state and an amount of charge stored in the capacitive storage element in the second state is independent on the internal runtime.

21. The oscillator circuit of claim 20, further comprising at least one threshold detector operable to detect the first state and second state of at least one capacitive storage element.

22. The oscillator circuit of claim 20, wherein each oscillator unit comprises:
a threshold detector configured to detect the first state and the second state of the capacitive storage element of the oscillator unit.

23. The oscillator circuit of claim 20, comprising a control circuit configured to control each oscillator unit such that it defines at least one clock sub-period in a clock period, by causing the capacitive storage element to change its charging state from a first charging state to a second charging state.

24. The oscillator circuit of claim 23, wherein the control circuit is configured to cause the capacitive storage element in each oscillator unit to be set back to the first charging state at or after an end of the sub-period.

25. An oscillator circuit comprising at least two oscillator units,
the at least two oscillator units being configured in an alternating order to generate a frequency determining sub-period,
wherein generating the sub-period comprises charging a capacitive storage element from a first charging state to a second charging state at a first terminal of the capacitive charging element and modifying a voltage applied to a second terminal of the capacitive charging element at a beginning of a sub-period, wherein the capacitive storage element contains a first amount of charge in the first charging state and a second amount of charge in the second charging state,
wherein a propagation delay on detection of the second charging state is compensated by precharging the capacitive storage element during a preceding sub-period to the first charging state being dependent on the propagation delay.

* * * * *